US008838017B2

(12) United States Patent
Muthali et al.

(10) Patent No.: US 8,838,017 B2
(45) Date of Patent: Sep. 16, 2014

(54) WIDEBAND JAMMER DETECTOR

(75) Inventors: Harish S. Muthali, Austin, TX (US); Shreyas Sen, Atlanta, GA (US)

(73) Assignee: QUALCOMM Incorporated, San Diego, CA (US)

( * ) Notice: Subject to any disclaimer, the term of this patent is extended or adjusted under 35 U.S.C. 154(b) by 284 days.

(21) Appl. No.: 12/582,090

(22) Filed: Oct. 20, 2009

(65) Prior Publication Data

US 2010/0245151 A1    Sep. 30, 2010

Related U.S. Application Data

(60) Provisional application No. 61/165,090, filed on Mar. 31, 2009.

(51) Int. Cl.
| | | |
|---|---|---|
| H04K 3/00 | (2006.01) | |
| H03F 1/48 | (2006.01) | |
| H03F 1/08 | (2006.01) | |
| H04B 1/7097 | (2011.01) | |
| H04B 1/10 | (2006.01) | |

(52) U.S. Cl.
CPC .............. *H03F 1/086* (2013.01); *H04B 1/7097* (2013.01); *H03F 1/483* (2013.01); *H04B 1/1027* (2013.01)
USPC .......................................... 455/1; 455/550.1

(58) Field of Classification Search
USPC ................. 455/127.2, 234.1, 134, 135, 214, 1
See application file for complete search history.

(56) References Cited

U.S. PATENT DOCUMENTS

| | | | |
|---|---|---|---|
| 3,958,083 A | 5/1976 | Hara et al. | |
| 4,752,939 A | 6/1988 | Amoroso et al. | |
| 4,973,966 A | 11/1990 | Zeewy | |
| 5,121,202 A | 6/1992 | Tanoi | |
| 5,448,598 A | 9/1995 | Yousefi et al. | |
| 5,471,509 A | 11/1995 | Wood et al. | |

(Continued)

FOREIGN PATENT DOCUMENTS

| | | |
|---|---|---|
| CN | 1266559 A | 9/2000 |
| CN | 101366268 A | 2/2009 |

(Continued)

OTHER PUBLICATIONS

Alberto Valdes-Garcia et al: "A Broadband CMOS Amplitude Detector for On-Chip RF Measurements" IEEE Transactions on Instrumentation and Measurement, IEEE Service Center, Piscataway, NJ, US, vol. 57, No. 7, Jul. 1, 2008, pp. 1470-1477, XP011205113 ISSN: 0018-9456 p. 1471, right-hand col.; figure 2.

(Continued)

*Primary Examiner* — Tu X Nguyen
(74) *Attorney, Agent, or Firm* — Kevin T. Cheatham

(57) ABSTRACT

Techniques for detecting jammer signals in a received signal are described. In one aspect, high-speed current mirror resistive compensation circuits and output impedance boosting circuits are utilized to increase amplifier bandwidth in an improved wideband amplifier circuit. In another aspect, a dual transistor configuration including common source topology, averaging capacitors and a comparator circuit is utilized to improve the sensing of signal peaks in a peak detector block, which can be used together with the wideband amplifier circuit and a digital jammer detection circuit to detect jammer signals. The digital jammer detection circuit aids in the determination of the presence of jammer signals within the received signal, the determination of which may be variable due to programmability of the digital jammer detection circuit as described.

17 Claims, 7 Drawing Sheets

(56) References Cited

U.S. PATENT DOCUMENTS

| | | | |
|---|---|---|---|
| 6,429,696 B1 | 8/2002 | Kao et al. | |
| 6,980,786 B1 | 12/2005 | Groe | |
| 7,009,603 B2 * | 3/2006 | Page et al. | 345/211 |
| 7,454,190 B2 * | 11/2008 | Schrodinger | 455/341 |
| 2002/0101936 A1 | 8/2002 | Wright et al. | |
| 2004/0198284 A1 | 10/2004 | Khorram | |
| 2005/0130687 A1 * | 6/2005 | Filipovic et al. | 455/522 |
| 2005/0215204 A1 | 9/2005 | Wallace et al. | |
| 2005/0221790 A1 | 10/2005 | Persico et al. | |
| 2005/0285781 A1 * | 12/2005 | Park et al. | 342/357.02 |
| 2006/0255860 A1 * | 11/2006 | Moussavi | 330/278 |
| 2007/0230610 A1 | 10/2007 | Poberezhskiy | |
| 2007/0232219 A1 | 10/2007 | Xiong | |
| 2007/0262817 A1 * | 11/2007 | Ciccarelli et al. | 330/278 |
| 2008/0069013 A1 | 3/2008 | Monier et al. | |
| 2009/0066394 A1 | 3/2009 | Kanda et al. | |
| 2009/0128706 A1 * | 5/2009 | Nagasawa et al. | 348/689 |
| 2010/0040178 A1 | 2/2010 | Sutton et al. | |
| 2010/0052968 A1 | 3/2010 | Patel et al. | |

FOREIGN PATENT DOCUMENTS

| | | |
|---|---|---|
| EP | 0987825 | 3/2000 |
| EP | 1635240 A1 | 3/2006 |
| JP | H08307924 A | 11/1996 |
| JP | H11239065 A | 8/1999 |
| JP | 2001053630 | 2/2001 |
| JP | 2003069436 A | 3/2003 |
| JP | 2004328639 A | 11/2004 |
| KR | 20090005189 A | 1/2009 |
| TW | 200807901 A | 2/2008 |

OTHER PUBLICATIONS

International Search Report and Written Opinion—PCT/US2010/029517—International Search Authority, European Patent Office,Nov. 9, 2010.

Partial International Search Report—PCT/US2010/029517, International Search Authority—European Patent Office—Jul. 1, 2010.

Schlogl F et al: "120nm CMOS OPAMP with 690 MHz fT and 128 dB DC gain" Solid-State Circuits Conference, 2005. ESSCIRC 2005. Proceedings of the 31st European, IEEE, Piscataway, NJ, USA LNKDDOI: 10.1109/ESSCIR.2005.1541607, Sep. 12, 2005, pp. 251-254, XP010854950 ISBN: 978-0-7803-9205-2.

Tetsuro Itakura et al: "A Feedforward Technique With Frequency-Dependent Current Mirrors for a Low-Voltage Wideband Amplifier" IEEE Journal of Solid-State Circuits, IEEE Service Center, Piscataway, NJ, US LNKD- 001:10.1109/4.509872, vol. 31, No. 6, Jun. 1, 1996, pp. 847-849, XP000620189 ISSN: 0018-9200.

Voo, et al., High-speed current mirror resistive compensation technique, Electronics Letters, 1995, vol. 31, vol. 4, pp. 248-250.

* cited by examiner

WIDEBAND JAMMER DETECTOR

CLAIM OF PRIORITY UNDER 35 U.S.C. §119

The present application for patent claims priority to Provisional Application No. 61/165,090 entitled, "Wideband Jammer Detector" filed Mar. 31, 2009, and assigned to the assignee hereof and hereby expressly incorporated by reference herein.

TECHNICAL FIELD

The present disclosure relates generally to electronics, and more specifically to a wideband jammer detector.

BACKGROUND

In communication devices, such as Code Division Multiple Access (CDMA) Global System for Mobile communications (GSM) and Wireless Local Area Network (WLAN) communication devices, the ability to detect jammer signals is necessary to improve the performance of the communication device. Communication devices include receiver circuits, which utilize correlation circuits to decipher a desired communication signal from all other received signals. Device performance is degraded when jammer signals are present during the correlation process.

Jammer signals can be introduced by internal or external sources. An internal jammer signal is a jammer signal which is introduced by the receiver. An example is a clock spur generated by a voltage controlled oscillator (VCO) within the receiver.

An external jammer signal is a jammer signal, which is introduced by a source external to the receiver. An example is a signal transmitted by a transmitter in another communication device that generates out-of-band emissions in the receive frequency band of the receiver.

A jammer signal impacts the sensitivity of a receiver in two ways. It can for example de-sense an analog-to-digital converter in the receiver thereby degrading its sensitivity. A jammer signal that appears at odd harmonics of a local oscillator signal in the receiver is down converted into the receive band to degrade signal sensitivity at baseband. Thus, errors may be introduced into the demodulated data packet when jammer signals are not detected by the receiver.

All jammer signals can thus degrade the performance of the receiver within the communication device, and ultimately the device's ability to process signals. Therefore, the ability to detect as many jammer signals as possible, even very low power jammer signals, helps to improve the performance of the receiver within the communication device.

In a typical CDMA device, for example, when a CDMA jammer signal is present, the receiver goes into protected mode where a decision is made by a jammer detector. The jammer detector detects close in jammer signals, such as jammer signals close to the receive (RX) band. A wideband jammer detector is capable of also detecting jammer signals hundreds of MHz away from the RX band. A jammer detector allows the receiver to operate in an un-protected or low power mode when no jammer signal is present and in protected or high power mode in the presence of jammer signals.

There is a need for a wideband jammer detector capable of detecting low power jammer signals over a wide bandwidth while consuming a minimal amount of power.

SUMMARY

This disclosure describes in general techniques for detecting jammer signals in a received signal.

In one aspect of the invention high-speed current mirror resistive compensation circuits and output impedance boosting circuits are utilized to increase amplifier bandwidth in an improved wideband amplifier circuit.

In another aspect of the invention, a dual transistor configuration including common source topology, averaging capacitors and a comparator circuit is utilized to improve the sensing of signal peaks in a peak detector block.

In another aspect of the invention, the peak detector block is used together with the wideband amplifier circuit and a digital jammer detection circuit to detect jammer signals.

In yet another aspect of the invention, the wideband amplifier circuit is used together with a peak detection circuit, a comparator circuit and a digital jammer detection circuit form a wideband jammer detector to detect jammer signals in a received signal of a communication device.

Figure 1:
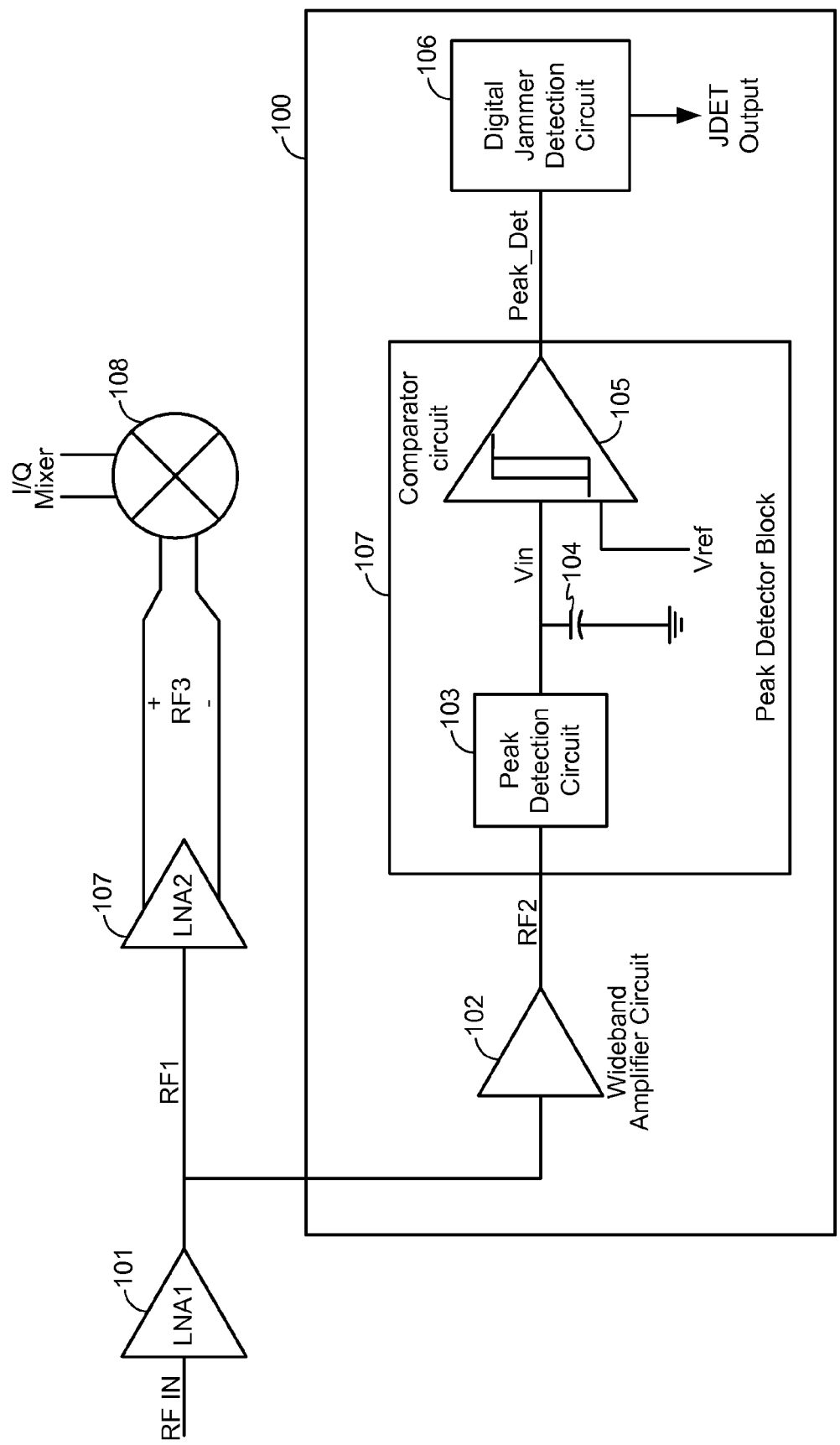
FIG. 1 is a block diagram of a receiver with a wideband jammer detector.

To facilitate understanding, identical reference numerals have been used where possible to designate identical elements that are common to the figures, except that suffixes may be added, when appropriate, to differentiate such elements. The images in the drawings are simplified for illustrative purposes and are not necessarily depicted to scale.

The appended drawings illustrate exemplary configurations of the disclosure and, as such, should not be considered as limiting the scope of the disclosure that may admit to other equally effective configurations. Correspondingly, it has been contemplated that features of some configurations may be beneficially incorporated in other configurations without further recitation.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein. FIG. 1 is a block diagram of a standard receiver with a wideband jammer detector 100. A radio frequency input signal RF IN is amplified by a first low noise amplifier (LNA) 101 to generate amplified signal RF1. Amplified signal RF 1 is coupled at an input to the wideband jammer detector 100 and also to an input of a second low noise amplifier 107. A differential output signal RF3 is generated by the second low noise amplifier 107 to in-phase and quadrature (I/Q) mixer 108.

Wideband jammer detector 100 comprises wideband amplifier circuit 102, peak detection circuit 103, averaging capacitor 104, comparator circuit 105, and digital jammer detection circuit 106. Wideband amplifier circuit 102 is a low power, wide bandwidth amplifier. Wideband amplifier circuit receives and amplifies RF1 from LNA 101 to generate amplified signal RF2. RF2 is connected to an input of peak detection circuit 103. Peak detection circuit 103 generates an output voltage level proportional to a peak voltage of amplified signal RF2.

Capacitor 104 is coupled at one end to ground. The opposite end of capacitor 104 is coupled to the output of peak detection circuit 103 and to a sampling input Vin of comparator circuit 105. Capacitor 104 serves to average the output of peak detection circuit 103. Comparator circuit 105 also receives a reference input Vref. The output of comparator circuit 105 varies as a function of input signals Vin and Vref. When Vin is greater than or equal to Vref, the output PEAK_DET of comparator circuit 105 switches to a logic high state. Conversely, when Vin is less than Vref, the output PEAK_DET switches to a logic low state. Peak detection circuit 103, capacitor 104 and comparator circuit 105 define a peak detector block 107.

PEAK_DET is coupled to the input of digital jammer detection circuit 106. Digital jammer detection circuit 106 samples the value of PEAK_DET over a programmed duration. The programmed duration may be controlled and varied during device operation. When digital jammer detection circuit 106 counts a programmed threshold number of logic level high samples within the programmed duration, digital jammer detection circuit 106 generates an interrupt output jammer detector signal JDET.

Figure 2B:
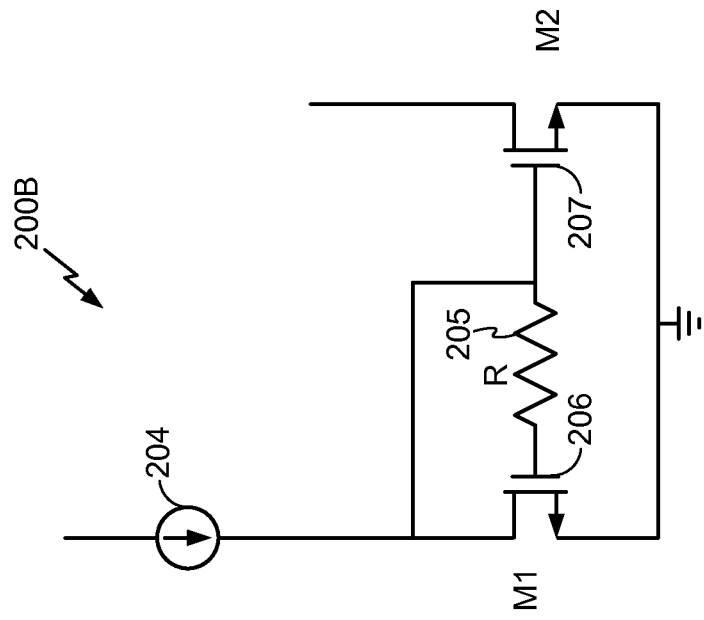
FIGS. 2A and 2B are circuit level diagrams of a standard current mirror resistive compensation circuit and a high-speed current mirror resistive compensation circuit, respectively.
Figure 2A:
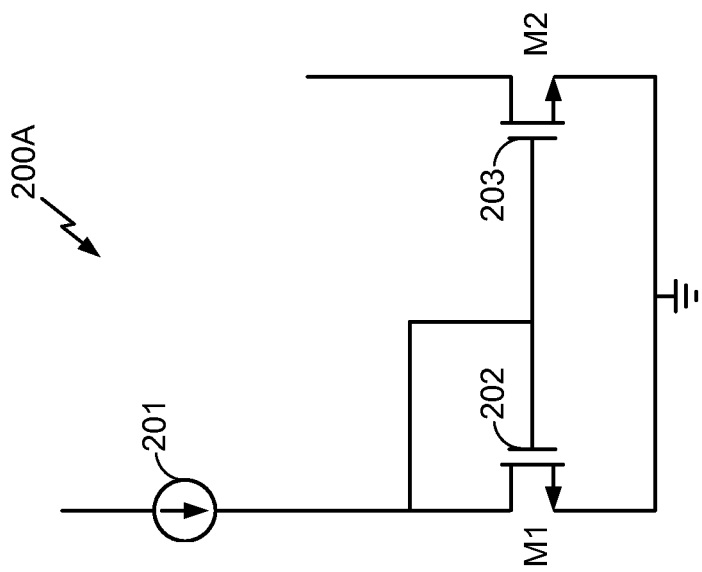

FIGS. 2A and 2B are circuit level diagrams of a standard current mirror circuit 200A and a high-speed current mirror resistive compensation circuit 200B, respectively.

A standard current mirror circuit 200A as shown in FIG. 2A comprises a current source 201 and two transistors 202 and 203. Transistors 202 and 203 are NMOS devices.

Transistor 202 is configured as the reference transistor with the drain of transistor 202 coupled to the gates of both transistors 202 and 203. A 3 db cutoff frequency for such standard current mirror configuration can be expressed as:

$$W_o = \frac{g_m}{2C_{gs}} \quad \text{Eq. (1)}$$

where, $g_m$ is the transconductance of transistor 202, $C_{gs}$ is the gate to source capacitance of transistor 202, and $\omega_o$ is the 3 dB cutoff frequency in radians.

By comparison, a high-speed current mirror resistive compensation circuit as shown in FIG. 2B comprises a current source 204, resistor 205, and two NMOS transistors 206 and 207. A first terminal of resistor 205 is coupled to the gate of transistor 206. A second terminal of resistor 205 is coupled to the gate of transistor 207 and the drain of transistor 206. Transistor 206 is configured as the reference transistor with the drain of transistor 206 coupled to the gate of transistor 207 and to the second terminal of resistor 205. A 3 dB cutoff frequency for such a high-speed current mirror resistive compensation configuration can be expressed as:

$$H(s) = \frac{\omega_o}{Z}\left[\frac{s+Z}{s^2 + 2\zeta\omega_o s + \omega_o^2}\right] \quad \text{Eq. (2)}$$

$$\omega_o = \sqrt{\frac{g_{m1}}{RC_{gs1}C_{gs2}}} \quad \text{Eq. (3)}$$

$$Z = \frac{1}{RC_{gs1}} \quad \text{Eq. (4)}$$

$$\zeta = \frac{C_{gs1} + C_{gs2}}{2\sqrt{g_{m1}RC_{gs1}C_{gs2}}} \quad \text{Eq. (5)}$$

when:

$$R = \frac{1}{g_{m1}} \Rightarrow \omega_o \frac{g_{m1}}{C_{gs1}} \Rightarrow f_1(\text{theoretical}) \quad \text{Eq. (6)}$$

where, $g_{m1}$ is the transconductance of transistor 202, $C_{gs1}$ is the gate to source capacitance of transistor 202, R is resistor 205, and $\omega_o$ is the 3 dB cutoff frequency in radians. As can be seen, the addition of resistor 205 increases the theoretical 3 dB cutoff frequency by a factor of 2 when resistor 205 has a resistive value equal to the reciprocal of the transconductance of transistor 206. This results in a significant increase in bandwidth.

Figure 3:
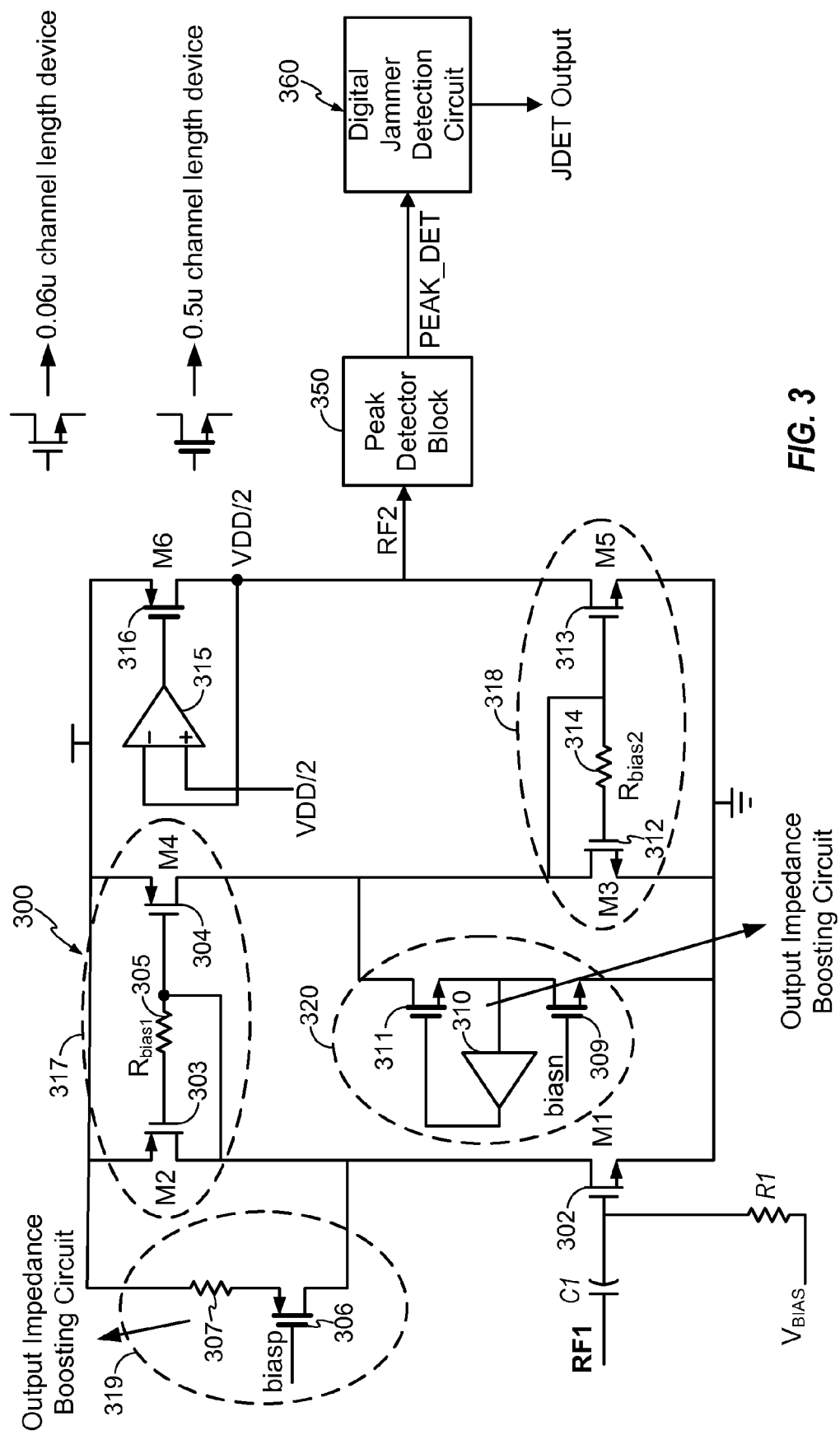
FIG. 3 is a schematic diagram of a wideband amplifier circuit, a peak detector block and a digital jammer detection circuit in accordance with an exemplary embodiment.

FIG. 3 is a schematic diagram of a wideband amplifier circuit 300, a peak detector block 350, and a digital jammer detection circuit 360 in accordance with an exemplary embodiment. Wideband amplifier circuit 300 comprises capacitor C1, resistor R1, PMOS input transistor 302, first and second high-speed current mirror resistive compensation circuits 317, 318, operational amplifier 315, NMOS transistor 316, and first and second output impedance boosting circuits 319, 320. Peak detection block 350 may comprise peak detection circuit 103, capacitor 104 and comparator circuit 105, as in the standard receiver shown in FIG. 1. Similarly, digital jammer detection circuit may comprise a circuit as in the digital jammer detection circuit 106 in the standard receiver shown in FIG. 1.

Alternatively, peak detection block 350 and digital jammer detection circuit 360 may correspond to new digital logic circuits described below in connection with FIGS. 4 and 6, respectively.

Referring back to FIG. 3, high-speed current mirror resistive compensation circuit 317 includes resistor 305 and PMOS transistors 303 and 304. High-speed current mirror resistive compensation circuit 318 includes resistor 314 and NMOS transistors 312 and 313.

A first terminal of capacitor C1 is coupled to the signal input RF1. A second terminal of capacitor C1 is coupled to the gate of transistor 302. The series coupling of the input signal RF1 through capacitor C1 provides AC-coupling of the input signal RF1. The AC coupling capacitor C1 isolates the DC level of the previous stage and allows NMOS transistor 302 to be biased at a desired value Vbias. A first terminal of resistor R1 is coupled to a voltage source $V_{bias}$. A second terminal of resistor 301 is coupled to the gate of transistor 302. Varying $V_{bias}$ controls the bias voltage applied to the gate of transistor 302. When additional gain is desired Vbias is increased to create an increased voltage between the gate and the source, $V_{GS}$, of transistor 302.

The relationship between $V_{GS}$ and the transistor drain current can be expressed as:

$$I_D = \frac{\mu_n C_{ox}}{2} \frac{W}{L}(V_{gs} - V_{th})^2 (1 + \lambda V_{DS}) \qquad \text{Eq. (7)}$$

where, $\mu_n$ is the charge-carrier effective mobility, W is the gate width, L is the gate length and $C_{ox}$ is the gate oxide capacitance per unit area of transistor 302. The relationship between drain current and transconductance can be expressed as:

$$g_m = \frac{2I_D}{V_{GS} - V_{th}} = \frac{2I_D}{V_{ov}} \qquad \text{Eq. (8)}$$

The source of transistor 302 is coupled to ground. The drain of transistor 302 is coupled to an active load including high-speed current mirror resistive compensation circuit 317 and output impedance boosting circuit 319. As described above, high-speed current mirror resistive compensation circuit 317 provides additional bandwidth by introducing a zero. The output impedance boosting circuit 319 increases the output resistance of transistor 302. The increase in output resistance increases the gain provided by transistor 302.

Output impedance boosting circuit 319 has two purposes. First, the output impedance boosting circuit diverts the DC current away from transistor 303, thereby allowing transistor 303 to be a small low current device with high bandwidth. Transistors 304 and 303 have a device size ratio of 4:1. The DC current as well as the RF current is amplified going from transistors 303 to 304. Second, output impedance boosting circuit 319 diverts the DC current away from the main path. However, output impedance boosting circuit 319 should not divert the RF signal from the main path. This is achieved by boosting the output impedance. The output impedance may be expressed as:

$$R_{OUT} = (1 + g_m R) r_{OUT} \qquad \text{Eq. (9)}$$

where, R is resistor 307 and $r_{OUT}$ is resistor 306.

The output of high-speed current mirror resistive compensation circuit 317 is coupled to high-speed current mirror resistive compensation circuit 318 and output impedance boosting circuit 320. Similar to output impedance boosting circuit 319, output impedance boosting circuit 320 has the same two purposes. The output impedance may be expressed as:

$$R_{OUT} = A(1 + g_m r_{OUT}) r_{OUT} \qquad \text{Eq. (10)}$$

where, A is amplifier 310 and $r_{OUT}$ is resistor 311.

The output impedance boosting is achieved with a different technique. The output of high-speed current mirror resistive compensation circuit 318 is coupled to the drain of transistor 316 and the negative input of operational amplifier 315. The positive input of operational amplifier 315 is coupled to a voltage source set to VDD/2. The operational amplifier 315 configuration drives the DC output of the wideband amplifier to VDD/2 by way of the virtual short effect between the inputs of an operational amplifier (OP AMP) 315. OP AMP 315 controls the gate voltage of transistor 316 to create a current source to feed transistor 313. OP AMP 315 ensures that the node RF2 is biased at VDD/2. This is achieved by driving the gate of the transistor M6 to whatever voltage in order that RF2 is set at VDD/2. RF2 feeds peak detector block 350.

The gain from RF input at transistor 302 to output node RF2 can be expressed as:

$$Gain_{DC} = g_m M 1 \left( \frac{W4 \times W5}{W2 \times W3} \right) R_{OUT} \qquad \text{Eq. (11)}$$

In general and as used herein, a gain may be (i) equal to one in linear unit, which is zero dB in logarithm unit, (ii) greater than one in linear unit, or (iii) less than one in linear unit. A gain of greater than one in linear unit corresponds to signal amplification and a positive gain (in dB). A gain of less than one in linear unit corresponds to signal attenuation and a negative gain (in dB). Attenuation is negative gain, so that an attenuation of x dB is equivalent to a gain of −x dB.

Figure 4:
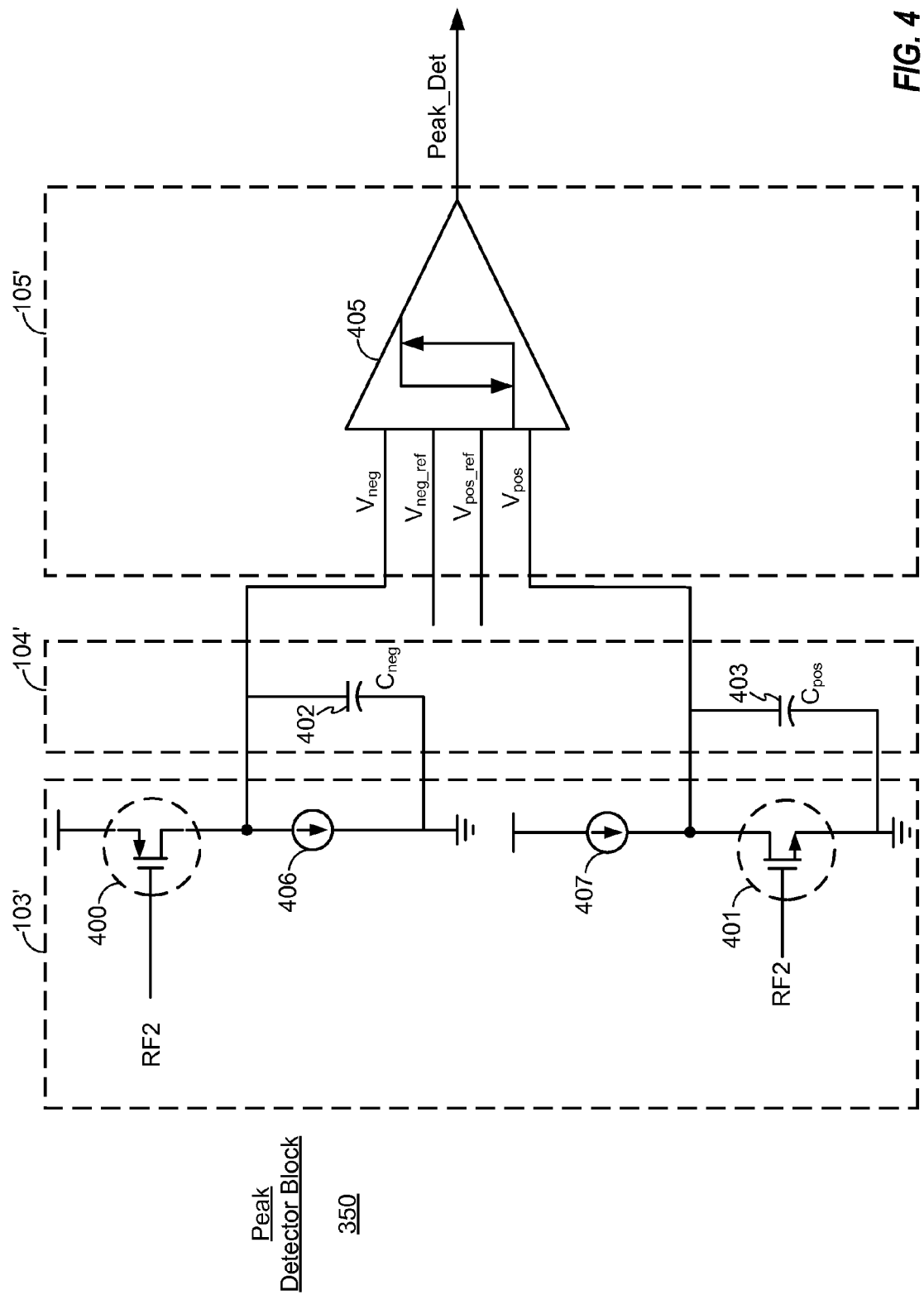
FIG. 4 shows a schematic diagram of a peak detector block in accordance with a further exemplary embodiment which can be used to peak detect the output RF2 from the wideband amplifier circuit in the standard receiver of FIG. 1 as well as a receiver incorporating the wideband amplifier circuit shown in FIG. 3.

FIG. 4 shows a schematic diagram of a peak detector block 350 in accordance with a further exemplary embodiment which can be used to peak detect the output RF2 from wideband amplifier circuit 102 in the standard receiver of FIG. 1 as well as a receiver incorporating the wideband amplifier circuit 300 shown in FIG. 3.

Peak detector block 350 includes a peak detection circuit 103', a capacitor coupling circuit 104' and a comparator circuit 105'. Peak detection circuit 103' includes an upper negative-peak detector portion and a lower positive-peak detector portion. The RF2 amplified output from a preceding stage is coupled to respective peak detector input transistors 400 and 401 in each of upper negative-peak and lower positive-peak detector portions. Transistor 400 is a PMOS transistor. The source of transistor 400 is coupled to VDD. PMOS transistor 400 is biased in weak inversion region to allow it to follow the negative peak of an amplified jammer signal. The drain of transistor 400 is coupled to current source 406. PMOS transistor 400 is configured in a common source configuration to allow detection of negative peak signals. A first terminal of capacitor 402 is coupled to the drain of transistor 400 and the negative sampling input $V_{neg}$ of comparator 405. A second terminal of capacitor 402 is coupled to ground. Capacitor 402 averages the output of transistor 400 to create signal $V_{neg}$. The negative threshold input $V_{neg\_ref}$ is set to a selected threshold voltage level. In some designs the selected threshold voltage level $V_{pos\_ref}$ may be programmable.

Transistor 401 is a NMOS transistor biased to operate in the weak inversion region so the transistor will follow the positive peak of the amplified jammer signal. The source of transistor 401 is coupled to ground. The drain of transistor 401 is coupled to current source 407. Thus, NMOS transistor 401 is configured in a common source configuration to allow detection of positive peak signals. A first terminal of capacitor 403 is coupled to the drain of transistor 401 and the positive sampling input of comparator 405. A second terminal of capacitor 403 is coupled to ground. Capacitor 403 averages the output of transistor 401 to create signal $V_{pos}$. The positive threshold input value $V_{pos\_ref}$ is set to a selected threshold voltage level. In some designs, the selected threshold voltage level $V_{pos\_ref}$ may be programmable.

Transistors 400 and 401 are biased to operate in weak inversion mode, otherwise known as "Cut-off" or "Sub-threshold" mode. Weak inversion occurs when the gate to source voltage is less than the threshold voltage of the transistor. Ideally, current should not flow through a transistor in weak inversion mode. However, due to the Boltzman distribution of electron energies some more energetic electrons at the source can enter the channel and flow to the drain of the transistor. This results in a sub-threshold current that is exponentially related to the gate to source voltage applied to the transistor. Operation in weak inversion mode allows transistors 400 and 401 to create an output current large enough to properly drive comparator 405. The relationship between gate to source voltage and sub threshold current may be expressed as:

$$I_D = I_{DO} e^{\frac{V_{GS}-V_{th}}{nV_T}}$$ Eq. (12)

where, $I_{D0}$=current at $V_{GS}=V_{th}$ and the slope factor n is given by $$n=1+C_D/C_{OX}$$ Eq. (13)

where, $C_D$=capacitance of the depletion layer and $C_{OX}$=capacitance of the oxide layer.

Comparator 405 compares the amplitude of input signal $V_{neg}$ with the amplitude of threshold signal $V_{neg\_ref}$. Comparator 405 also compares the amplitude of input signal $V_{pos}$ with the amplitude of threshold signal $V_{pos\_ref}$. When either input signal has larger amplitude than the amplitude of the corresponding threshold signal, the comparator 405 output signal PEAK_DET is set to a logic high state. When both input signals have lower amplitude than the amplitude of the corresponding threshold signal the comparator 405 output signal PEAK_DET is set to a logic low state.

As described in FIG. 1, a conventional digital jammer detection circuit 106 samples the output of comparator 105 over a programmed duration. The programmed duration may be controlled and varied during device operation. When the digital jammer detection circuit 106 counts more than a programmed threshold number of logic level high samples within the programmed duration, digital detection circuit 106 generates an interrupt output signal JDET.

Figure 5:
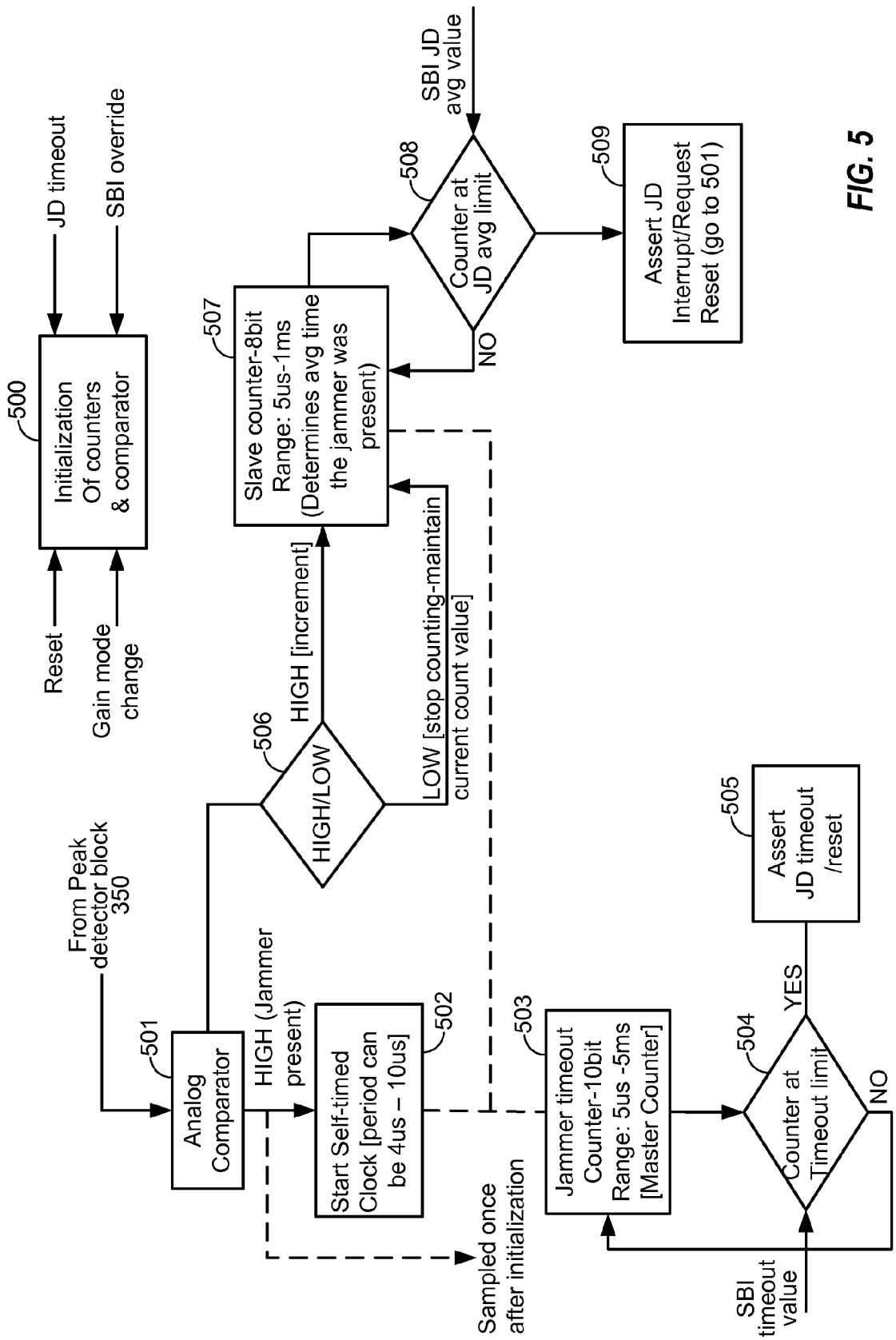
FIG. 5 shows an operational flow diagram of a digital jammer detection circuit 350 in accordance with an exemplary embodiment.

FIG. 5 shows an operational flow diagram of a digital jammer detection circuit 350 in accordance with an exemplary embodiment.

In step 500, the comparator circuit 150 and all counters are initialized. Step 500 may be initiated by different events, such as: powering on the device, jammer detection circuit timeout, single wire bus interface (SBI) override, global reset, or gain mode transition. In step 500, a digital jammer detection circuit clock is reset. Once the digital jammer detection circuit clock is reset in step 500, two independent processes begin to operate in parallel. The first independent process includes steps 503, 504, and 505. The second independent process includes steps 506, 507, 508 and 509.

The first independent process includes steps 503, 504, and 505. In step 503, the digital jammer detection circuit timeout period is provided. In step 504, the digital jammer detection circuit determines whether the jammer detection circuit timeout period provided in step 503 has elapsed. If the digital jammer detection circuit timeout period has not elapsed step 504 is repeated. In step 505, a reset request is sent if the jammer timeout period has elapsed.

The second independent process includes steps 506, 507, 508 and 509. In step 506 the digital jammer detection circuit samples the output of comparator 105 and determines if the sampled output is a logic high signal. If the sampled output is not a logic high signal the counting is stopped and current count value is maintained. In step 507, the slave counter determines the average time the jammer was present. In step 508, the digital jammer detection circuit determines if the peak counter value is greater than the programmed peak threshold value. In step 509, a jammer interrupt signal is sent and a reset request generated sending the process back to step 501.

The digital jammer detection circuit determines if an external reset request has been made. An external interrupt may be initiated by different events, such as: single wire bus interface (SBI) overwrite, global device reset, or gain mode transition.

Figure 6A:
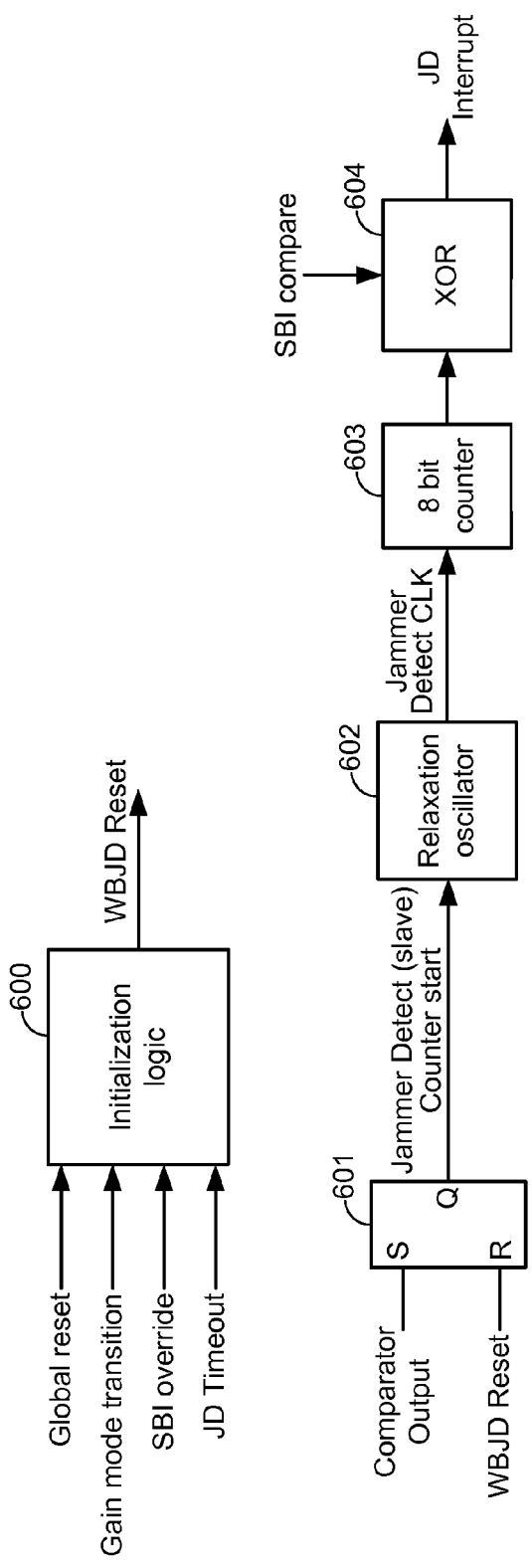
FIGS. 6A and 6B show two different digital logic configurations for implementing a digital jammer detection circuit in accordance with an exemplary embodiment.
Figure 6B:
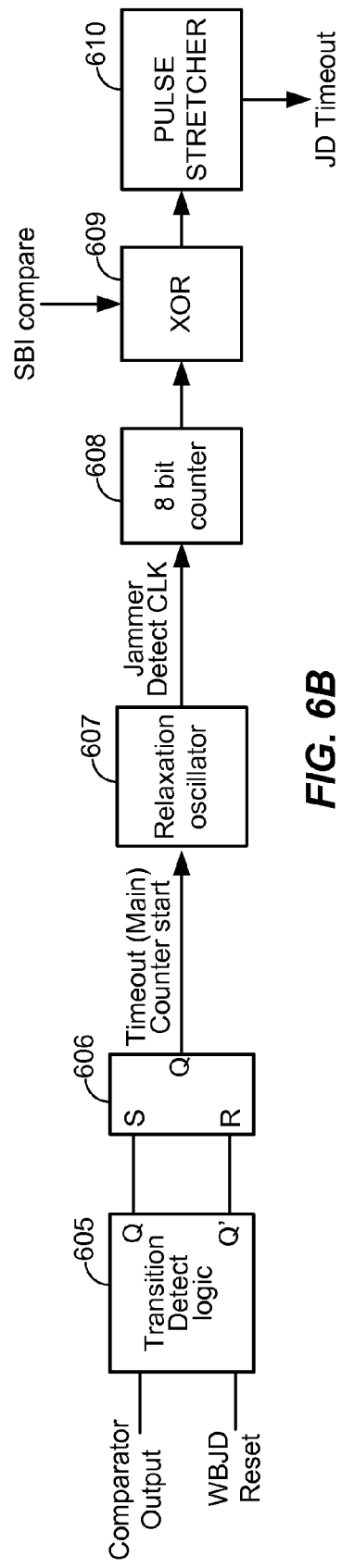

FIGS. 6A and 6B show two different digital logic configurations for implementing digital jammer detection circuit 360 in accordance with an exemplary embodiment. Block 600 is the initialization logic, which generates a digital jammer detection circuit reset signal when any of the following inputs are triggered: global reset, gain mode transition, SBI override, or digital jammer detection circuit timeout.

In FIG. 6A, block 601 is an SR latch circuit. An SR latch circuit is an arrangement of logic gates that maintains a stable output after the inputs have been turned off. A SR latch circuit has a set input (S) and a reset input (R). When the set input is logic high state the output is set to a logic high state. When the reset input is a logic high state the output is set to a logic low state. The output of block 601 is coupled to the input of block 602.

Block 602 is a relaxation oscillation circuit. A relaxation oscillation circuit is an oscillator circuit that utilizes a capacitor, which is charged gradually and then discharged rapidly. A relation circuit may be implemented with a resistor or current source, a capacitor, and a threshold device such as an injunction transistor or Gunn diode. When the output of block 601 is ON the relaxation oscillator 602 creates an output signal, which oscillates at a predetermined frequency.

The oscillating output signal is the digital jammer detection circuit clock. The relaxation oscillator output is coupled to the input of the 8-bit counter 603. The 8-bit counter 603 counts the oscillations sampled. 8-bit counter 603 outputs the number of oscillations, which have been observed. A first input to XOR circuit 604 is coupled to the output of the 8-bit counter 603. A second input of XOR circuit 604 is coupled to a SBI compare signal. XOR circuit 604 determines a threshold compare value from the SBI compare signal. XOR circuit 604 compares the number provided by the 8-bit counter 603 with the SBI compare value. If the number provided by the 8-bit counter 603 is greater than the SBI compare value the XOR circuit 604 generates a jammer detected interrupt signal.

In FIG. 6B, block 605 is a transition detect logic. Transition detect logic 605 detects any change or transition of the logic level of the input signals and generates a constantly high logic level on its corresponding output. The Q output of transition detect logic 605 is coupled to the S input of SR latch 606. The Q' output (inverse of Q output) of transition detect logic 605 is coupled to the R input of SR latch 606. The transition detector purpose is to detect the comparator output going high when a jammer signal is first present after the circuit is initialized. This starts the "scanning" mode when the circuit starts scanning for jammer signals. The transition detector triggers the timeout counter, which determines the time for which the circuit needs to scan for a jammer signal. If the jammer count reaches the desired threshold (determined by slave counter) before the timeout counter triggers then the JDET signal goes HIGH indicating jammer signal detection.

Block 606 is an SR latch circuit. An SR latch circuit is an arrangement of logic gates that maintains a stable output after the inputs have been turned off. An SR latch circuit has a set input (S) and a reset input (R). When the set input is logic high state the output is set to a logic high state. When the reset input is a logic high state the output is set to a logic low state. The output of block 606 is coupled to the input of block 607.

Block 607 is a relaxation oscillator. A relaxation oscillator is an oscillator circuit that utilizes a capacitor, which is charged gradually and then discharged rapidly. A relaxation oscillator may be implemented with a resistor or current source, a capacitor, and a threshold device such as a unijunction transistor or Gunn diode. When the output of block 606 is a logic high signal the relaxation oscillator 607 creates an output signal which oscillates at a predetermined frequency. The oscillating output signal is the digital jammer detection circuit clock. The relaxation oscillator output is coupled to the input of the 8-bit counter 608. The 8-bit counter 608 counts the oscillations sampled. 8-bit counter 608 outputs the number of oscillations, which have been observed.

Figure 7:
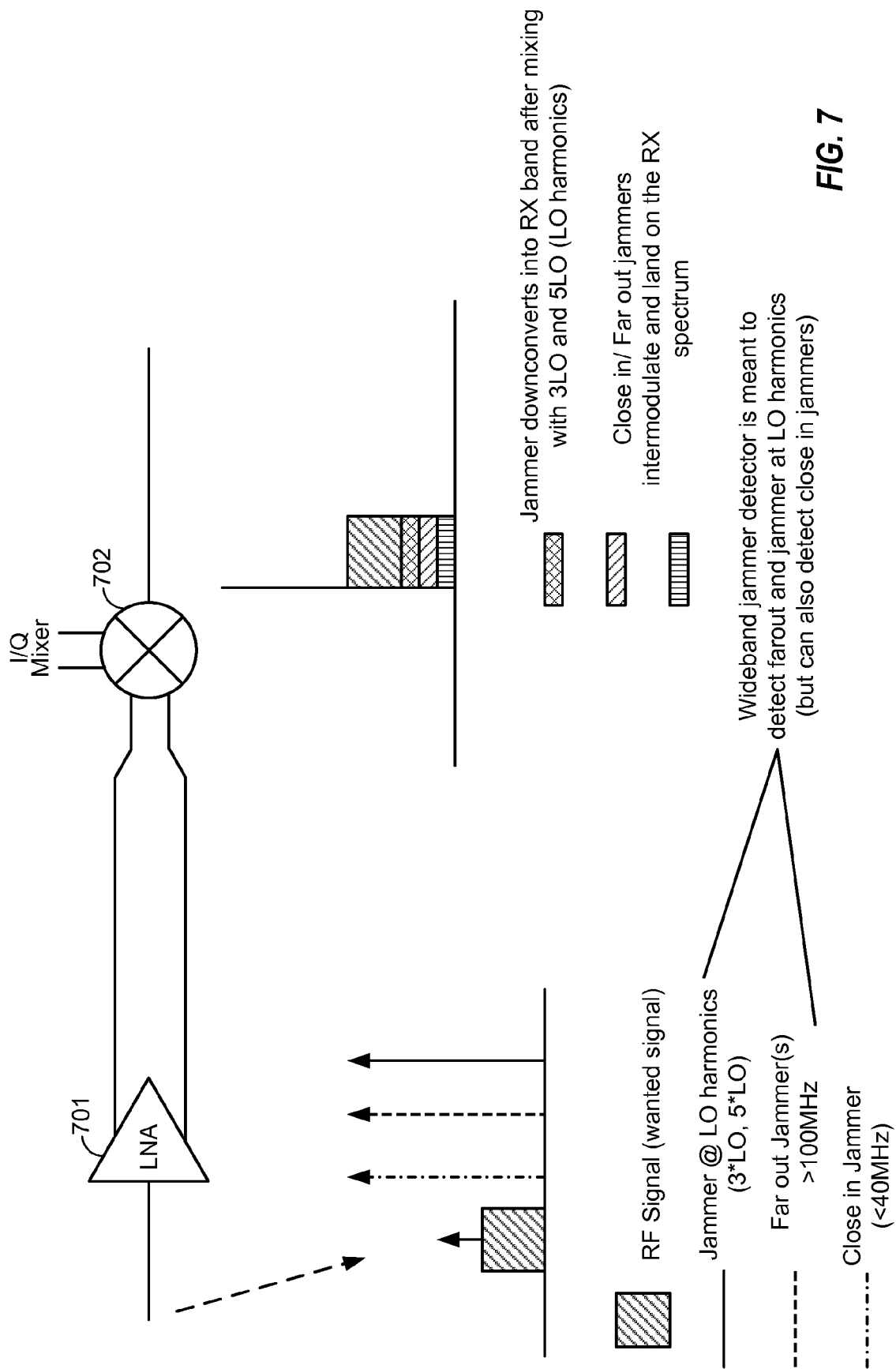
FIG. 7 is a block diagram of a receiver path.

A first input to XOR circuit 609 is coupled to the output of 8-bit counter circuit 608. A second input of XOR circuit 609 is coupled to a SBI compare signal. XOR circuit 609 determines a threshold compare value from the SBI compare signal. XOR circuit 609 compares the number provided by the 8-bit counter 608 with the SBI compare value. If the number provided by the 8-bit counter 608 is greater than the SBI compare value the XOR circuit 609 generates a jammer detected interrupt signal. The output of XOR circuit 609 is coupled to the input of pulse stretcher circuit 610. Pulse stretcher 610 generates a extended reset signal, which is meant to reset the internal states/counters when a jammer timeout occurs FIG. 7 shows a block diagram of a receiver path. The differential output terminals of LNA 701 are coupled to I/Q mixer 702. The input signal coupled to the input of LNA 701 contains the desired RF signal, local oscillator (LO) signals, close in jammer signals and far out jammer signals. In accordance with the exemplary embodiments described herein, wideband jammer detector 100 detects the presence of LO signals, close in jammer signals and far out jammer signals.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodi-

What is claimed is:

1. A peak detector block comprising: a first transistor, a second transistor, a first capacitor, a second capacitor and a comparator circuit, wherein:
   a gate terminal of the first transistor is coupled to a signal input;
   a source terminal of the first transistor is coupled to a first power source;
   a drain terminal of the first transistor is coupled to a first terminal of the first capacitor and a first input terminal of the comparator circuit;
   a second terminal of the first capacitor is coupled to a ground source;
   a gate terminal of the second transistor is coupled to the signal input;
   a source terminal of the second transistor is coupled to the ground source;
   a drain terminal of the second transistor is coupled to a first terminal of the second capacitor and a second input terminal of the comparator circuit, wherein the comparator circuit is configured to compare a first signal provided to the first input terminal of the comparator to a first threshold signal and to compare a second signal provided to the second input terminal of the comparator to a second threshold signal; and
   a second terminal of the second capacitor is coupled to the ground source.

2. The peak detector block of claim 1, where at least one of the first transistor and the second transistor is biased to operate in weak inversion mode.

3. The peak detector block of claim 1, where the first transistor is a PMOS transistor and the second transistor is a NMOS transistor.

4. The peak detector block of claim 1, where the first and second transistors are coupled in a common source configuration.

5. The peak detector block of claim 1, where each of the first and second threshold signals is programmable.

6. The peak detector block of claim 1, wherein the drain terminal of the first transistor is coupled to a current source.

7. The peak detector block of claim 6, wherein the drain terminal of the second transistor is coupled to a second current source.

8. The peak detector block of claim 1, wherein the comparator circuit is configured to generate an output signal having a first value in response to the first signal having a larger amplitude than an amplitude of the first threshold signal, and wherein the comparator circuit is configured to generate the output signal having the first value in response to the second signal provided to the second input terminal of the comparator having a larger amplitude than an amplitude of the second threshold signal.

9. A wideband jammer detector including:
   a wideband amplifier circuit;
   a peak detection circuit;
   a comparator circuit; and
   a digital jammer detection circuit, wherein:
      a signal input is coupled to an input terminal of the wideband amplifier circuit;
      an output terminal of the wideband amplifier circuit is coupled to an input terminal of the peak detection circuit;
      an output terminal of the peak detection circuit is coupled to a first input terminal of the comparator circuit;
      a threshold signal input is coupled to a second input terminal of the comparator circuit;
      an output of the comparator circuit is coupled to an input terminal of the digital jammer detection circuit; and
      the wideband amplifier circuit includes a first active load and a second active load, wherein the first active load is coupled to a drain terminal of an input transistor, wherein the first active load is configured as a high-speed current mirror resistive compensation circuit, wherein the second active load is coupled to the drain terminal of the input transistor, and wherein the second active load is configured as an output impedance boosting circuit.

10. The wideband jammer detector of claim 9, wherein a programmable threshold signal is provided to the second input terminal of the comparator circuit via the threshold signal input.

11. The wideband jammer detector of claim 9, wherein the wideband amplifier circuit further includes a third active load coupled to a output of the first active load configured as a second high-speed current minor resistive compensation circuit, and a fourth active load coupled to the output of the first active load and configured as a second output impedance boosting circuit.

12. The wideband jammer detector of claim 9, wherein the high-speed current mirror resistive compensation circuit includes:
   a first transistor;
   a second transistor; and
   a first resistor, wherein:
      a drain terminal of the first transistor is coupled to the drain terminal of the input transistor;
      a source terminal of the first transistor is coupled to a gate terminal of the second transistor;
      a first terminal of the first resistor is coupled to the gate terminal of the first transistor;
      a second terminal of the first resistor is coupled to a gate terminal of the second transistor;
      a source terminal of the first transistor is coupled to a power source; and
      a source terminal of the second transistor is coupled to the power source.

13. The wideband jammer detector of claim 9, wherein the peak detection circuit includes a first transistor, a second transistor, a first capacitor, a second capacitor, wherein the comparator circuit includes a comparator, and wherein:
   a gate terminal of the first transistor is coupled to a signal input;
   a source terminal of the first transistor is coupled to a first power source;
   a drain terminal of the first transistor is coupled to a first terminal of the first capacitor and to a first input terminal of the comparator;
   a second terminal of the first capacitor is coupled to a ground source;
   a gate terminal of the second transistor is coupled to the signal input;
   a source terminal of the second transistor is coupled to the ground source;
   a drain terminal of the second transistor is coupled to a first terminal of the second capacitor and to a second input terminal of the comparator; and
   a second terminal of the second capacitor is coupled to the ground source.

14. The wideband jammer detector of claim 9, wherein the digital jammer detection circuit comprises:
- means for amplifying a received signal;
- means for measuring a peak of the received signal;
- means for comparing the peak of the received signal with a threshold signal;
- means for counting the number of peaks which are greater in magnitude than the threshold signal during a desired duration; and
- means for generating an interrupt signal if a counted number of peaks is greater than a threshold value.

15. An apparatus comprising:
- means for amplifying a signal;
- means for detecting a peak of the amplified signal;
- means for comparing the peak of the amplified signal to a threshold signal;
- means for detecting a digital jammer signal, wherein:
  - a signal input is coupled to an input terminal of the means for amplifying;
  - an output terminal of the means for amplifying the signal is coupled to an input terminal of the means for detecting the peak of the amplified signal;
  - an output terminal of the means for detecting the peak of the amplified signal is coupled to a first input terminal of the means for comparing;
  - a threshold signal input is coupled to a second input terminal of the means for comparing;
  - an output terminal of the means for comparing is coupled to an input terminal of the means for detecting a digital jammer signal; and
  - the means for amplifying includes a first active load and a second active load, wherein the first active load is coupled to a drain terminal of an input transistor, wherein the first active load is configured as a high-speed current mirror resistive compensation circuit, wherein the second active load is coupled to the drain terminal of the input transistor, and wherein the second active load is configured as an output impedance boosting circuit.

16. The apparatus of claim 15, wherein the threshold signal is programmable.

17. The apparatus of claim 15, wherein the means for amplifying further includes a third active load and a fourth active load wherein the third active load is coupled to an output of the first active load, wherein the third active load is configured as a second high-speed current minor resistive compensation circuit, wherein the fourth active load is coupled to the output of the first active load, and wherein the fourth active load is configured as a second output impedance boosting circuit.

\* \* \* \* \*